(12) United States Patent
Iwasaki

(10) Patent No.: US 6,633,502 B2
(45) Date of Patent: Oct. 14, 2003

(54) TEST DEVICE FOR SEMICONDUCTOR MEMORY CIRCUIT

(75) Inventor: Tamaki Iwasaki, Moriguchi (JP)

(73) Assignee: Matsushita Electric Industrial Co., Ltd. (JP)

(*) Notice: Subject to any disclaimer, the term of this patent is extended or adjusted under 35 U.S.C. 154(b) by 5 days.

(21) Appl. No.: 10/143,577

(22) Filed: May 13, 2002

(65) Prior Publication Data
US 2002/0167055 A1 Nov. 14, 2002

(30) Foreign Application Priority Data
May 14, 2001 (JP) ....................................... 2001-143774

(51) Int. Cl.⁷ ................................................ G11C 7/00
(52) U.S. Cl. .................................... 365/201; 365/189.09
(58) Field of Search ........................... 365/201, 189.09, 365/230.06; 714/726, 728, 733

(56) References Cited

U.S. PATENT DOCUMENTS 6,324,664 B1 * 11/2001 Farwell et al. .............. 714/726
6,359,818 B2 * 3/2002 Suzuki ........................ 365/201

FOREIGN PATENT DOCUMENTS

JP          2000-227458          8/2000

* cited by examiner

Primary Examiner—Anh Phung
(74) Attorney, Agent, or Firm—Parkhurst & Wendel, L.L.P.

(57) ABSTRACT

A semiconductor device is provided with a memory, scan chains each comprising plural flip-flops, combination circuits which receive the outputs from the respective flip-flops in the scan chains, and a selector circuit which receives the outputs from the respective flip-flops and the outputs from the combinational circuits, selects test signals outputted from the flip-flops when the semiconductor device is in a test mode, and outputs the test signals to the memory, thereby to operate the memory. Therefore, stress can be reliably applied to the memory when a burn-in test is carried out.

11 Claims, 10 Drawing Sheets

TEST DEVICE FOR SEMICONDUCTOR MEMORY CIRCUIT

FIELD OF THE INVENTION

The present invention relates to a semiconductor device and, more particularly, to a semiconductor device which applies stress to a test circuit to be subjected to a burn-in test, using plural flip-flops which are connected in a scan chain.

BACKGROUND OF THE INVENTION

In recent years, as the scale of semiconductor devices has been increased, reliability tests such as a burn-in test have become more important. However, when testing a large-scale semiconductor device, it is very difficult to realize 100% of the actual operation state of the semiconductor device on a set device, by a combination of prepared signal sources. Therefore, a burn-in test or the like is carried out by applying stress to a circuit to be tested, utilizing a scan design method. The simulation stress application using the scan design method is carried out as follows. An equivalent test pattern is formed by the scan design method, and stress is applied to the test pattern to realize a circuit operation rate equivalent to that in the actual operation mode, with a restricted pattern length. Thereby, when a semiconductor device is subjected to a reliability test or the like, the ratio of operating circuits in the semiconductor device can be brought close to that in the actual operation state, although it is not equivalent to the actual operation state.

Hereinafter, a description will be given of a burn-in test using scan chains in a conventional semiconductor device.

First of all, the construction of a conventional semiconductor device will be described with reference to FIG. 10. In FIG. 10, a semiconductor device 1 comprises a memory 2, scan chains 14a and 14b each comprising plural flip-flops 11, combinational circuits 12, and a clock generation circuit 13 for outputting a clock signal 105. The scan chains 14a and 14b have first and second scan input terminals 16 and 17 to which input signals 101 and 102 are applied, and first and second scan output terminals 18 and 19 from which output signals 103 and 104 are outputted, respectively. A scan chain is a chain of flip-flops which are connected such that an output for scanning from a previous-stage flip-flop becomes a normal input to a subsequent-stage flip-flop when performing a scan test.

In the semiconductor device 1 constructed as described above, when performing a test using the scan chains 14a and 14b, since the plural flip-flops 11 are chain-connected from the scan input terminals 16 and 17 to the scan output terminals 18 and 19 in the scan chains 14a and 14b, respectively, desired data values can be set on arbitrary flip-flops by inputting the signals 101 and 102 to the scan input terminals 16 and 17 when performing a scan test (hereinafter referred to as "scan shift"). After the setting of data values is completed, the combinational circuits 12 are operated by the normal operation of the semiconductor device 1 to perform a scan shift, whereby stress is applied to the memory 2 which is a target circuit to be tested in the semiconductor device 1. At this time, the values of the output signals 103 and 104 from the scan output terminals 18 and 19 are compared with a predetermined expected value, thereby performing a circuit test in the semiconductor device 1. A test comprising a series of operations as described above is called a scan shift or a burn-in test using scan chains.

When subjecting the semiconductor device 1 to a burn-in test using scan chains, the above-described scan shift and normal operation are repeated, whereby the target circuit to be tested in the semiconductor device 1 is operated more actively to give greater stress to the circuit, thereby testing the reliability of the semiconductor device 1.

In the conventional semiconductor device 1 constructed as described above, however, since the outputs from the respective flip-flops 11 in the scan chains 14a and 14b are inputted to the memory 2 as a target circuit to be tested through the combinational circuits 12, the desired data values inputted from the scan input terminals 16 and 17 might be changed in the combinational circuits 12, depending on the constructions of the combinational circuits 12, to become undefined values, resulting in difficulty in controlling the memory 2 during the test. This makes it difficult to apply stress to the whole memory 2 and, at the worst, no stress might be applied to the memory 2.

As a solution to the above-described problem, there is proposed a method in which the conventional semiconductor device is provided with an auxiliary circuit (not shown) such as an address counter, and stress is applied to the entire area of the memory 2 by counting up the address counter or the like. In this method, however, when a lot of memory circuits and analog circuits as test targets are mounted on a system LSI under test, more auxiliary circuits as described above are required, and the chip area increases in proportion to the number of the auxiliary circuits to be mounted, and therefore, miniaturization of the chip cannot be achieved. Furthermore, it is necessary to perform a test on the auxiliary circuits in addition to the ordinary test, resulting in a problem concerning the tests, i.e., increased time and cost for the tests.

SUMMARY OF THE INVENTION

The present invention is made to solve the above-described problems and has for its object to provide a semiconductor device performing a burn-in test using scan chains, which semiconductor device can reliably apply stress to a target circuit to be tested, such as a memory, during the burn-in test, without requiring auxiliary circuits for stress application.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a semiconductor device comprising: a test circuit to be subjected to a test; plural flip-flops which are connected in a scan chain; and a selector circuit for receiving the outputs from the plural flip-flops, add the outputs from combinational circuits which receive the outputs from the plural flip-flops, selecting the outputs from the plural flip-flops as test signals when the semiconductor device is in a test mode, and outputting the test signals to the test circuit, thereby to operate the test circuit. Therefore, stress can be easily and reliably applied to the test circuit without increasing auxiliary circuits for stress application when a burn-in test is carried out. Further, since a control circuit for controlling the selector circuit is controlled using an external input terminal group, the circuit structure of the control circuit is easily realized.

According to a second aspect of the present invention, the semiconductor device according to the fir t aspect further comprises a control circuit for outputting plural control signals for controlling the selecting operation of the selector circuit; and the control circuit has a decoder circuit for decoding signals of predetermined contents, which are supplied from the outside, and outputting signals corresponding to the contents of the decoded signals, as the control signals, to the selector circuit. Therefore, the number of external input terminals connected to the control circuit is reduced, and the circuit structure of the control circuit is easily realized.

According to a third aspect of the present invention, in the semiconductor device according to the second aspect, the control circuit further includes plural flip-flops which are connected in a scan chain, and the flip-flops hold the signals supplied from the outside, and output the signals to the decoder circuit. Therefore, the number of external input terminals is further reduced, and it is particularly effective in performing a wafer-level burn-in test or the like in which the number of probes or the like is restricted. Further, since the area of the control circuit is reduced, the chip area of the semiconductor device is reduced.

According to a fourth aspect of the present invention, in the semiconductor device according to the first aspect, the selector circuit comprises: first selectors for receiving the outputs from the plural flip-flops and thy outputs from the combinational circuits, selecting the outputs from the plural flip-flops as the test signals during the test mode, and outputting the test signals to the test circuit, thereby to operate the test circuit; and second selectors for receiving the outputs from the plural flip-flops and the outputs from the flip-flops in the stages previous to the respective flip-flops, selecting the outputs from the respective flip-flops during the test mode, thereby to make the respective flip-flops maintain the present values. Therefore, adjustment of clock timings among the respective flip-flops is facilitated.

According to a fifth aspect of the present invention, in the semiconductor device according to the first aspect, the plural flip-flops are operated on the basis of a clock signal supplied from the outside; and the semiconductor device further includes a logic gate circuit for stopping the supply of the clock signal during the test mode, thereby to make the respective flip-flops maintain the present values. Therefore, the construction for holding the output values is easily realized.

According to a sixth aspect of the present invention, in the semiconductor device according to the first aspect, the selector circuit includes a data generation circuit for counting up or down the values which are held by N (N: natural number) flip-flops among the plural flip-flops, according to a clock signal supplied from the outside, and outputting the counted up or down values held by the N flip-flops as the test signals to the test circuit, thereby to operate the test circuit. Therefore, stress can be applied to all combinations of addresses in the test circuit, or all write data, without setting data on the respective flip-flops in the scan chain, whereby control of the semiconductor device is facilitated.

According to a seventh aspect of the present invention, in the semiconductor device according to the sixth aspect, the data generation circuit comprises: first selectors for receiving the outputs from the N flip-flops, and the outputs from N combinational circuits which receive the outputs from the N flip-flops, selecting the outputs from the respective flip-flops as the test signals during the test mode, and outputting the test signals to the test circuit, thereby to operate the test circuit; a second selector for a least significant bit, which receives the output from a NOT circuit that receives the output from a flip-flop for a least significant bit, and the output from a flip-flop in the stage previous to the flip-flop for the least significant bit, among the N flip-flops; and second selectors for bits other than the least significant bit, which receives the outputs from an $EX_{13}OR$ circuit that receives the outputs from (N−1) flip-flops for the bits other than the least significant bit, and the outputs from the flip-flops in the stages previous to the (N−1) flip-flops, among the N flip-flops. Therefore, when the semiconductor device is in the test mode, stress can be applied to the test circuit without setting data on the respective flip-flops by scan shift, whereby control of the semiconductor device is facilitated.

According to an eighth aspect of the present invention, in the semiconductor device according to the sixth aspect, when the semiconductor device is in the test mode, the data generation circuit sets an address of N bits of the test circuit, which address is to be inputted as one of the test signals. Therefore, stress can be applied to all combinations of addresses in the test circuit, without setting data on the respective flip-flops in the scan chain, whereby control of the semiconductor device is facilitated.

According to a ninth aspect of the present invention, in the semiconductor device according to the sixth aspect, when the semiconductor device is in the test mode, the data generation circuit sets a data value of N bits of the test circuit, which data value is to be inputted as one of the test signals. Therefore, stress can be applied to all write data in the test circuit, without setting data on the respective flip-flops in the scan chain, whereby control of the semiconductor device is facilitated.

According to a tenth aspect of the present invention, in the semiconductor device according to the first aspect, the test circuit is a memory. Therefore, when the semiconductor device performs a burn-in test, stress can be easily applied to the memory as a circuit to he tested, without adding a circuit dedicated to the test only.

According to an eleventh aspect of the present invention, in the semiconductor device according to the first aspect, the test circuit is an analog circuit to which digital signals can be inputted. Therefore, when the semiconductor device performs a burn-in test, stress can be easily applied to the analog circuit as a circuit to be tested, without adding a circuit dedicated to the test only.

DETAILED DESCRIPTION OF THE PREFERRED EMBODIMENT

Embodiment 1

Hereinafter, a semiconductor device according to a first embodiment of the present invention will be described.

Figure 1:
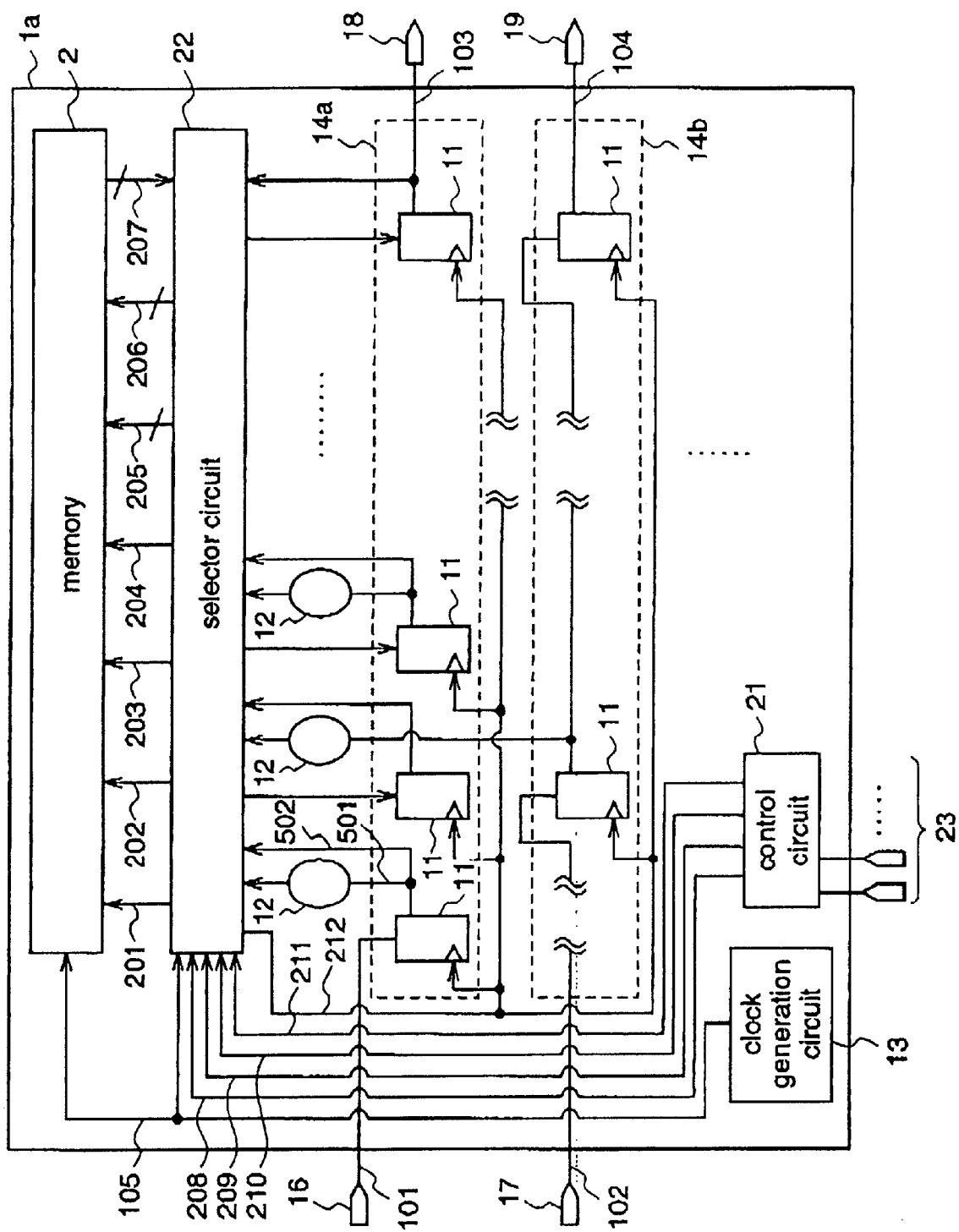
FIG. 1 is a block diagram illustrating a semiconductor device according to a first embodiment of the present invention.

FIG. 1 is a block diagram illustrating the construction of a semiconductor device 1a according to the first embodiment.

The semiconductor device 1a includes, in addition to the construction of the conventional semiconductor device 1, a selector circuit 22 which controls access to the memory 2, an external input terminal group 23 from which signals for controlling the selector circuit 22 are inputted to the semiconductor device 1a, and a control circuit 21 which generates selection signals 208~211 for controlling the selector circuit 22.

The selection signal 208 selects a write signal 201 and a read signal 202 to be inputted to the memory 2, the selection signal 209 selects a chip select signal 203 and an output permission signal 204 to the memory 2, and the selection signal 210 selects an address signal 205 and write data 206 to the memory 2, and read data 207 from the memory 2. Further, each of the selection signals 208~210 controls as to whether the signal to be inputted to the selector circuit 22 from the flip-flop 11 connected to each of the signals 201~207 should be a signal 502 that is directly outputted from the flip-flop 11 (at test operation) or a signal 501 that is outputted from the flip-flop 11 through the combinational circuit 12 (at normal operation). The selection signal 211 controls the values to be outputted to the respective flip-flops 11 in the scan chains 14a and 14b. Further, a clock signal 212, which is generated from a clock signal 105 outputted from the clock generation circuit 13, is supplied to the respective flip-flops 11 in the scan chains 14a and 14b. Although in FIG. 1 only a single signal is shown as each of the memory address signal 205, write data signal 206, and read data signal 207, actually there are plural signals as each of the signals 205~207 according to the bit widths of the addresses or the bit widths of the data, and the number of flip-flops to be connected to these signals 205~207 is also increased according to the increase in the number of these signals.

The other constituents shown in FIG. 1 are almost identical to those of the conventional semiconductor device 1 and, therefore, repeated description is not necessary.

Next, the operation of the semiconductor device 1a according to the first embodiment will be described. In this first embodiment, it is premised that the memory 2 is operated when the write signal 201, read signal 202, chip select signal 203, and output permission signal 204 are "0", respectively.

First of all, a signal for instructing the semiconductor device 1 to perform a scan shift operation is supplied from the external input terminal group 23 to the control circuit 21. On receipt of this signal, the control circuit 21 generates control signals 208~211 indicating this instruction, and outputs these signals to the selector circuit 22.

During the scan shift operation, "0" is set on the flip-flops 11 which are connected to the read signal 201, write signal 202, chip select signal 203, and output permission signal 204 of the memory 2, and an address to which stress is to be applied is set on the flip-flop 11 connected to the address signal 205 of the memory 2, and a data value is set on the flip-flop 11 connected to the write data 206, from the scan input terminals 16 and 17.

Next, a signal instructing that the memory 2 should be accessed by the signals 502 which are directly outputted from the plural flip-flops 11 in the scan chains 14a and 14b, is supplied from the external input terminal group 23 to the control circuit 21. On receipt of this signal, the control circuit 21 generates control signals 208~211 indicating this instruction, and outputs these control signals to the selector circuit 22.

When the clock generation circuit 15 supplies a clock signal 105 to the memory 2 and to the selector circuit 22, all of the write signal 201, read signal 202, chip select signal 203, and output permission signal 204 of the memory 2 go into their active states, whereby data are inputted to the memory 2 from the respective flip-flops in the scan chain 14a and 14b through the selector circuit 22, and stress is applied to the address and write data which are set on the flip-flops while the clock signal 105 is being supplied. While stress is being applied to the memory 2, the output values from the selector circuit 22 to the respective flip-flops 11 are controlled by the selection signal 211 from the selector circuit 22 so that the data values in the flip-flops 11 connected to the selection signals 201~206 are maintained.

The read data 207 which is read from the memory 2 is inputted to the respective flip-flops 11 In the scan chains 14a and 14b, and the data in the respective flip-flops 11 are read to the outside through the scan output terminals 18 and 19, as output signals 103 and 104, by the scan shift operation. The read data are compared with a predetermined expected value, thereby testing the target circuit (memory 2) in the semiconductor device 1a.

As described above, according to the first embodiment, the semiconductor device 1a is provided with the external input terminal group 23, the selector circuit 22, and the control circuit 21, and the selection signals 208~211 for controlling the selector circuit 22 are generated on the basis of the signal supplied from the external input terminal group 23, and the signals 502 which have not been passed through the combinational circuits 12 are selected by the selection signals 208~211 as the outputs from the respective flip-flops connected to the memory 2 when a test is carried omit, whereby stress can be reliably applied to a desired position in the memory 2. Further, since the selection signals 208~211 for controlling the control circuit 21 are supplied from the external input terminal group 23, the construction of the control circuit 22 is simplified.

When the above-described data setting on the respective flip-flops in the scan chains 14a and 14b is repeated by the number of all addresses in the memory 2, stress can be applied to the entire area of the memory 2.

While in the semiconductor device 1a according to the first embodiment the flip-flops 11 in the scan chains 14a and 14b are connected to the respective signals 201~207 to be applied to the memory 2, the flip-flops in the plural scan chains provided in the semiconductor device 1a are available as the flip-flops 11 to be connected to the respective signals 201~207. Further, if the flip-flops 11 as many as the number of the signals to be applied to the target circuit to be tested can be taken from a single scan chain, the flip-flops 11 in this scan chain may be used. That is, the number of the scan chains to be used depends on the number of the signals required for the target circuit to be tested, the arrangement of the scan chains in the semiconductor device 1a, the arrangement of the respective circuits in the semiconductor device 1a, or the like.

Embodiment 2

Hereinafter, a semiconductor device according to a second embodiment of the present invention will be described.

In this second embodiment, the control circuit 21 in the semiconductor device 1a according to the first embodiment will be described in detail.

Figure 2:
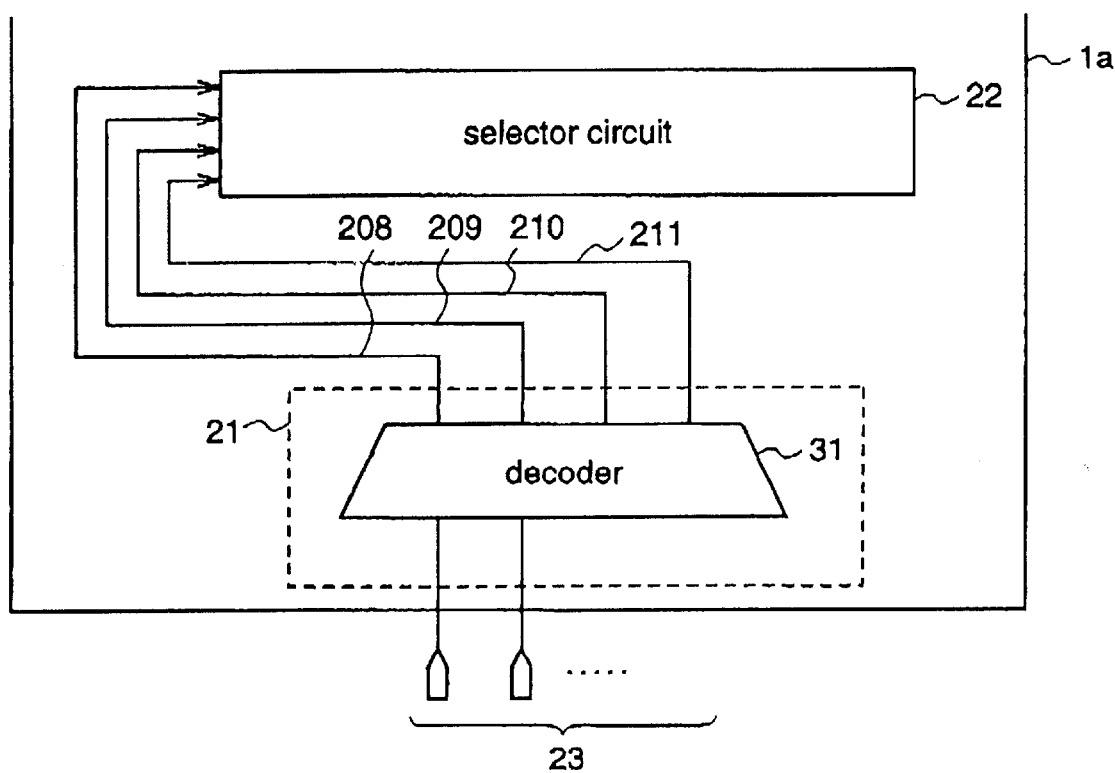
FIG. 2 is a block diagram illustrating a control circuit of a semiconductor device according to a second embodiment of the present invention.

FIG. 2 is a block diagram illustrating the specific construction of the control circuit 21 in the semiconductor device 1a according to the second embodiment.

With reference to FIG. 2, the control circuit 21 in the semiconductor device 1a comprises a plurality of external input terminals (an external input terminal group) 23, and a decoder 31 for decoding signals supplied from the external input terminal group 23 to generate selection signals 208~211 for controlling the selector circuit 22 according to the decoded contents. The number of the input terminals of the external input terminal group 23 is not less than two, which is smaller than the number of the output terminals of the control circuit 21 to the selector circuit 22. For example, in FIG. 2, as the number of the output terminals of the control circuit 21 is four, the number of the input terminals of the external input terminal group 23 is two or three.

In FIG. 2, the same reference numerals as those shown in FIG. 1 denote the same or corresponding parts and, therefore, repeated description is not necessary.

Next, the operation of the semiconductor device 1a according to the second embodiment will be described.

First of all, a signal of predetermined contents instructing a scan shift operation is set on the external input terminal group 23.

Then, in the control circuit 21, the decoder 31 decodes the signal which is set from the external input terminal group 23, generates control signals 208~211 according to the contents of the decoded signal, and outputs the control signals 208~211 to the selector circuit 22.

By the above-mentioned scan shift operation, "0" is set on the respective flip-flops 11 connected to the read signal 201, write signal 202, chip select signal 203, and output permission signal 204 of the memory 2, from the scan input terminals 16 and 17, and an address to which stress is to be applied is set on the flip-flop 11 connected to the address signal 205 of the memory 2, and further, a data value is set on the flip-flop 11 connected to the write data 206.

Next, a signal instructing that the memory 2 should be accessed by the signals 502 which are directly outputted from the plural flip-flops 11 in the scan chains 14a and 14b is supplied from the external input terminal group 23 to the control circuit 21, and the control circuit 21 generates selection signals 208~210 on the basis of the signal supplied from the external input terminal group 23.

Thereby, the selector circuit 22 can select the signals to be supplied to the memory 2 according to the input signal to the external input terminal group 23. To be specific, the selector circuit 22 selects the signals 501 which have been passed through the combinational circuits 12 and inputs these signals 501 to the memory 2 when the semiconductor device 1a performs the normal operation, and selects the signals 502 which have been directly outputted from the flip-flops 11 and inputs these signals 502 to the memory 2 when the semiconductor device 1a performs a test.

The remainder of the operation of the semiconductor device 1a is identical to that described for the first embodiment and, therefore, repeated description is not necessary.

As described above, according to the second embodiment, the signal supplied from the external input terminal group 23 is decoded by the decoder 31, and the decoded values are outputted as the selection signals 208~211 for controlling the selector circuit 22. Therefore, the number of the input terminals of the external input terminal group 23 can be reduced, and the circuit construction can be easily realized.

Figure 3:
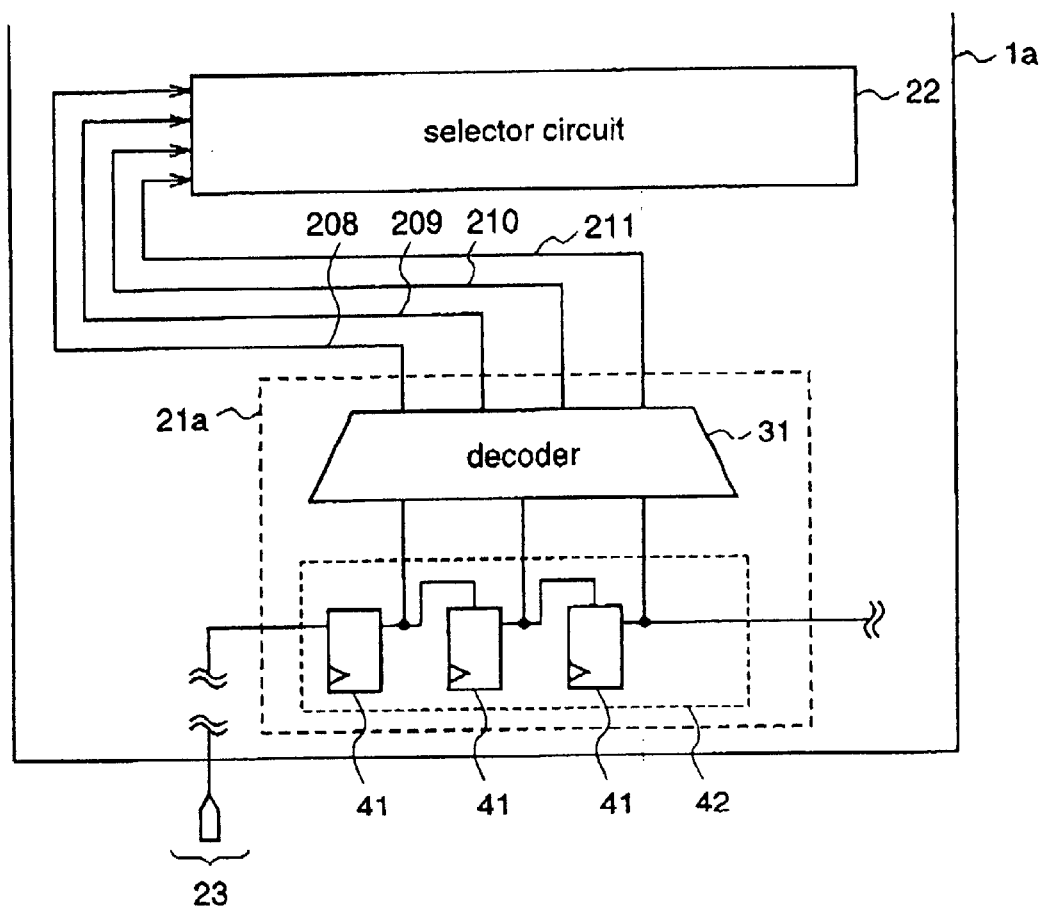
FIG. 3 is a block diagram illustrating a control circuit of a semiconductor device according to a third embodiment of the present invention.

While in the above description the number of the input terminals of the external input terminal group 23 is not less than two and is smaller than the number of the signals outputted from the control circuit 21, the number of the input terminals of the external input terminal group 23 can be further reduced when the control circuit of the semiconductor device 1a is constituted by a decoder 31 and a scan chain 42 comprising plural flip-flops as shown in FIG. 3. This reduction in the number of the input terminals is particularly effective for a wafer-level burn-in test or the like in which the number of probes or the like is restricted.

Hereinafter, a description will be given to the construction of the semiconductor device 1a in which thee number of the input terminals of the external input terminal group 23 is further reduced.

FIG. 3 is a diagram illustrating another example of a control circuit in the semiconductor device according to the second embodiment.

With reference to FIG. 3, a control circuit 21a comprises a decoder 31, and a scan chain 42 comprising plural flip-flops 41, and the external input terminal group 23 has a single input terminal. As for this scan chain 42, a scan chain that is already existing in the semiconductor device 1a may be employed, like the scan chains 14a and 14b connected to the memory 2. Other constituents of the semiconductor device 1a are identical to those shown in FIG. 2.

The operation of the semiconductor device 1a constructed as described above is as follows. A signal is supplied from the input terminal group 23, data are set on the respective flip-flops 41 in the scan chain 42, and the data values set on the flip-flops are decoded by the decoder 31.

While in FIG. 3 the control circuit 21a includes a single scan chain for holding the data values to be inputted to the decoder 31, the control circuit 21a may have plural scan chains to be connected to the decoder 31, according to the number of the signals to be outputted from the control circuit 21a, the arrangement of the respective circuits in the semiconductor device 1a, the arrangement of the scan chains in the semiconductor device 1a, or the like. In this case, however, the number of the input terminals of the external input terminal group 23 should be the same as the number of the scan chains.

While in FIG. 3 the control circuit 21a is provided with the scan chain 42 comprising the plural flip-flops as a means for holding the data values to be inputted to the decoder 31, any means other than the scan chain may be used for holding the data values to be inputted to the decoder 31 as long as it can hold the signal supplied from the external input terminal group 23. For example, any element capable of holding the data status, such as flip-flops, latches, RAMs, ROMs, or the like, may be employed with the same function and effect as described above.

It is needless to say that the decoder 31 in the control circuit 21 is dispensed with when the number of the input terminals of the external input terminal group 23 is equal to the number of the signals to be outputted from the control circuit 21a to the selector circuit 22.

Embodiment 3

Hereinafter, a semiconductor device according to a third embodiment of the present invention will be described.

In this third embodiment, the construction of the selector circuit 22 in the semiconductor device 1a will be described.

Initially, the construction of the selector circuit 22 in the semiconductor device 1a according to the third embodiment will be described with reference to FIG. 4.

Figure 4:
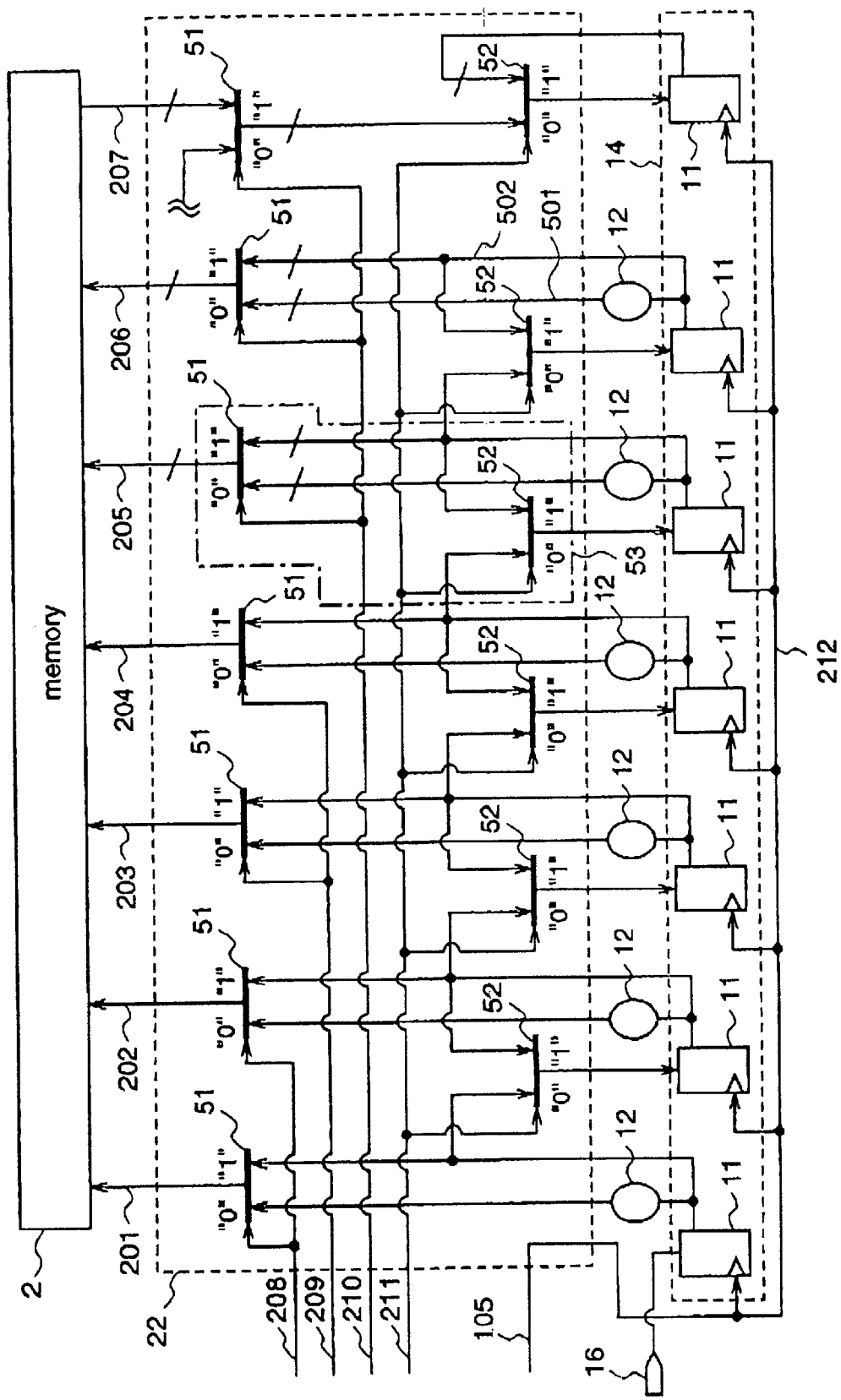
FIG. 4 is a block diagram illustrating a selector circuit of a semiconductor device according to a fourth embodiment of the present invention.

In FIG. 4, the selector circuit 22 in the semiconductor device 1a comprises input selectors 51 for selecting, as the signals to be inputted to the memory 2, either the signals 502 which are directly outputted from the flip-flops 11 in the scan chain 14 or the signals 501 which are outputted through the combinational circuits 12 to be used for the normal operation of the semiconductor device, according to selection signals 208~210; output selectors 52 for selecting, as the values to be held in the flip-flops 11 in the scan chain 14, either the values which are presently held in the flip-flops 11 or the values updated to the values outputted from the previous-stage flip-flops, according to the selection signal 211; and address selector circuits 53 each comprising the input selector 51 and the output selector 52, and outputting an address signal 205 to the memory 2. In FIG. 4, for simplification, only a single scan chain is employed. Further, the same reference numerals as those shown in FIG. 1 denote the same or corresponding parts and, therefore, repeated description is not necessary.

Next, the operation of the semiconductor device 1a constructed as described above will be described with reference to FIG. 5.

Figure 5:
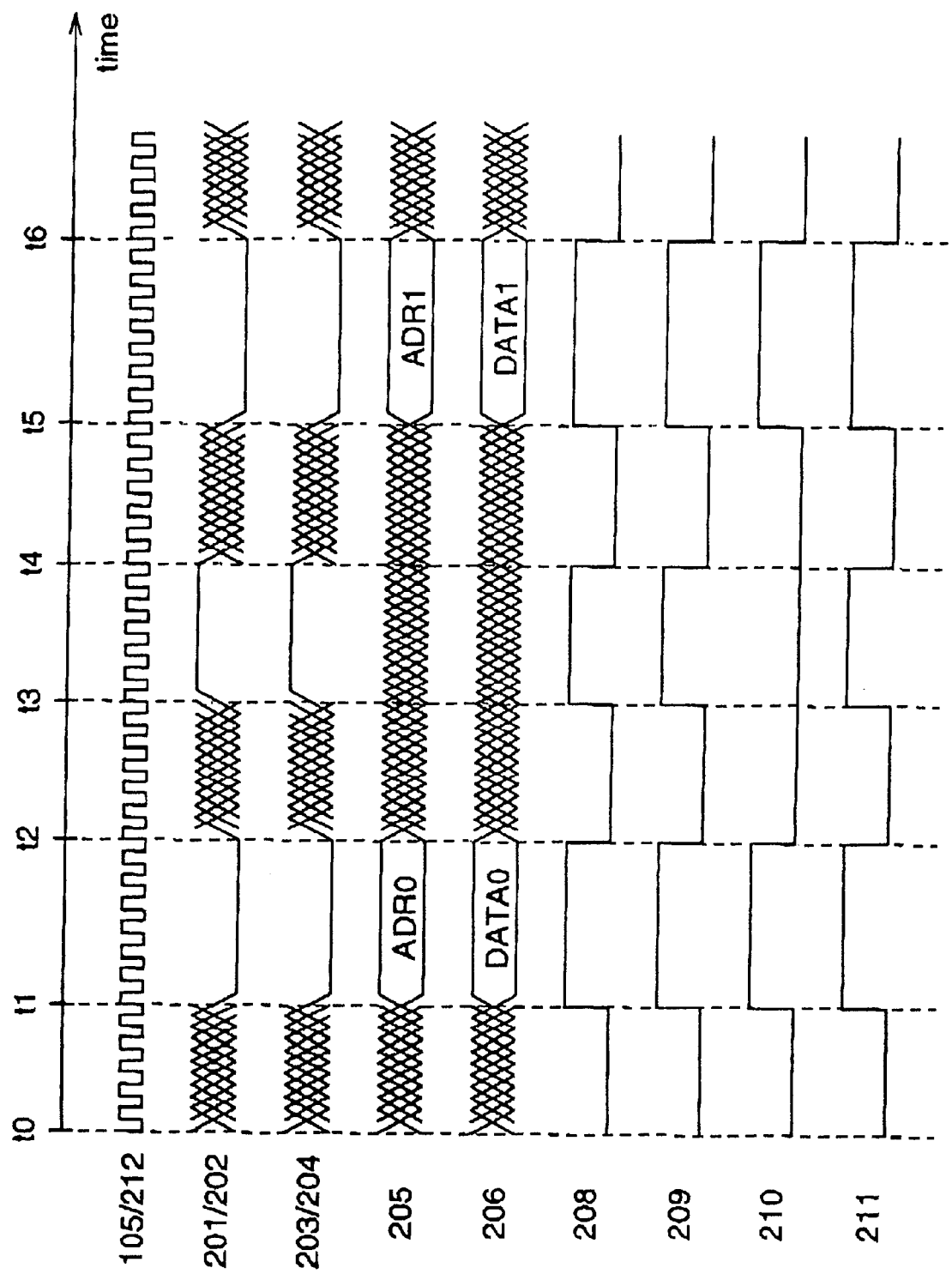
FIG. 5 is an operation timing chart of the selector circuit of the semiconductor device according to the fourth embodiment.

FIG. 5 is a timing chart for explaining the operation of the semiconductor device 1a according to the third embodiment. In FIG. 5, t0–t1, t2–t3, and t4–t5 are scan shift periods, and t1–t2, t3–t4, and t5–t6 are stress application periods to the memory 2.

When the selection signals 208, 209, and 210 are "1", the input selectors 51 select the signals 502 which are directly outputted from the respective flip-flops 11 in the scan chain 14. When the selection signal 211 is "1", the output selectors 52 select the present values of the respective flip-flops to be held as they are. As described for the first embodiment, the memory 2 is operated when the write signal 201, read signal 202, chip select signal 203, and output permission signal 204 are "0".

Initially, at time t0, signals of "0" are given to the selection signals 208, 209, 210, and 211 from the external input terminal group 23 through the control circuit 21 (not shown).

By this setting, the input selectors 51 select the signals at the normal operation, i.e., the signal's 501 which are outputted from the flip-flops 11 through the combinational circuits 12, and the output values from the combinational circuits 12, i.e., undefined values, are inputted to the memory 2 by the write signal 201, read signal 202, chip select signal 203, output permission signal 204, addresses signal 205, and write data signal 206.

Further, by the above-mentioned setting, the output selectors 52 select, as the values of the respective flip-flops 11 in the scan chain 14, the values outputted from the previous-stage flip-flops 11, and update the values of the respective flip-flops 11 to the values of the previous-stage flip-flops 11.

During a period from t0 to t1, as described for the first embodiment, "0" is set on the respective flip-flops 11 in the scan chain 14 which are connected to the write signal 201, read signal 202, chip select signal 203, and output permission signal 204, from the scan input terminal 16 by the scan shift operation, and an address value to which stress is to be applied is set on the flip-flop 11 connected to the address signal 205, and further, a data value is set on the flip-flop 11 connected to the write data signal 206.

Next, at time t1, signals of "1" are given to the selection signals 208, 209, 210, and 211 from the external input terminal group 23 through the control circuit 21 (not shown). By this setting, the input selectors 51 select the signals 502 which are directly outputted from the respective flip-flops 11 in the scan chain 14, and the output selectors 52 select the values being held by the respective flip-flops 11, and hold the values as they are.

During a period from t1 to t2, a clock signal 105 is applied plural times to the memory 2 and to the selector circuit 22, whereby a clock signal 212 is applied to the respective flip-flops 11 in the scan chain 14 so as to update the values of the write signal 201, read signal 202, chip select signal 203, output permission signal 204, address signal 205, and write data 206. However, since the output selectors 52 and the address selector circuits 53 are controlled by the selection signal 211 so as to hold the present values of the flip-flops 11 as they are, the present output values are maintained in the flip-flops 11.

After the clock signal 105 is applied to the memory 2 by a desired number of times, signals of "0" are given to the selection signals 208, 209, 210, and 211 at time t2.

By this setting, the input selectors 51 select the signals 502 at the normal operation, and the output selectors 52 select the values of the previous-stage flip-flops, thereby updating the values of the respective flip-flops.

Next, during a period from t2 to t3, data are set on the flip-flops 11 in the scan chain 14 from the scan input terminal 16 by scan shift so that the write signal 201, read signal 202, chip select signal 203, and output permission signal 204 become "1".

At time t3, signals of "1" are given to the selection signals 208, 209, and 211 from the external input terminal group 23 through the control circuit 22 (not shown) and, during a period from t3 to t4, signals of "1" are given to the write signal 201, read signal 202, chip select signal 203, and output permission signal 204 from the scan input terminal 16 by scan shift, thereby applying stress to the memory 2.

At time t4, "0" is set on the selection signals 208, 209, and 211 from the external input terminal group 12 through the control circuit 22 (not shown), and "0" is set on the write signal 201, read signal 202, chip select signal 203, and output permission signal 204 from the scan input terminal 16 by scan shift, and an address value and write data, which are different from those to which stress was applied during the period from t1 to t2, are set on the flip-flops connected to the address signal 205 and the write data signal 206, respectively.

At time t5, signals of "1" are given to the selection signals 208, 209, 210, and 211 from the external input terminal group 23 through the control circuit 21 (not shown) and, during a period from t5 to t6, the clock 105 is applied plural times to the memory 2 and to the selector circuit 22.

A series of operations described above are repeated by the number of times equal to the number of the addresses of the sequential memory 2, whereby stress can be applied to the entire area of the memory 2.

As described above, according to the third embodiment of the present invention, since the selector circuit 22 is provided with the input selectors 51, the output signals from the plural flip-flops 11 to be inputted to the memory 2 as a test target can be selected so that the signals directly outputted from the respective flip-flops 11 are inputted to the memory 2 when the semiconductor device 1a is in the test mode. Further, since the selector circuit 22 is provided with the output selectors 52, it can be decided whether the values being held by the respective flip-flops are to be outputted as they are or the values are to be updated to the output values from the previous-stage flip-flops, and the values being held by the flip-flops 11 can be maintained as they are when the semiconductor device 1a is in the test mode, whereby adjustment of the clock timing among the flip-flops 11 is facilitated.

When the signals from the flip-flops 11 in the scan chain 14 are directly connected to the memory 2 without the intervention of the combinational circuits 12, the input selectors 51 are not necessary. Further, even when the output selector 52 is constituted by using flip-flops with load hold functions, the same functions and effects as described above are achieved.

Embodiment 4

Hereinafter, a semiconductor device according to a fourth embodiment of the present invention will be described.

In this fourth embodiment, a selector circuit 22a in the semiconductor device 1a, having a construction different from that of the selector circuit 22 according to the third embodiment, will be described in detail. In the third embodiment, the selector circuit 22 is provided with the output selectors 52 for deciding whether the data values of the respective flip-flops 11 are to be maintained or the data values are to be updated to the values of the previous-stage flip-flops, and the data values to be held in the respective flip-flops 11 are controlled by controlling the output selectors 52 according to the selection signal 211. On the other hand, the selector circuit 22a according to this fourth embodiment is provided with a circuit for generating a clock signal 212 to be supplied to the respective flip-flops 11 in the scan chain 14, and the data values to be held in the flip-flops 11 are controlled by the clock signal 212.

Initially, the construction of the selector circuit 22a in the semiconductor device 1a according to the fourth embodiment will be described with reference to FIG. 6.

Figure 6:
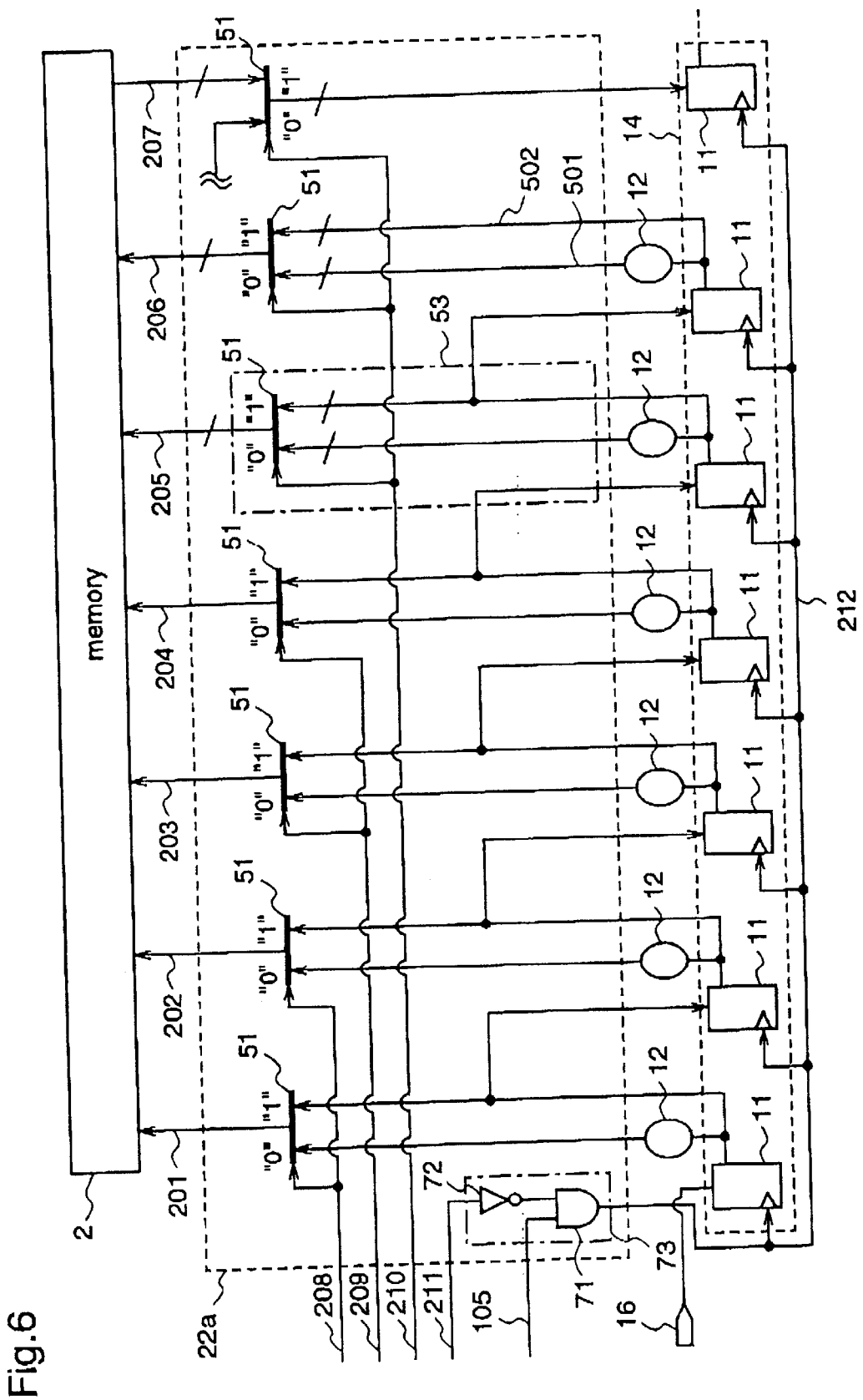
FIG. 6 is a block diagram illustrating a selector circuit according to a fifth embodiment of the present invention.

In FIG. 6, the selector circuit 22a is provided with input selectors 51 for selecting either the signals 502 which are indirectly outputted from the flip-flops 11 in the scan chain 14 or the signals 501 which are passed through the combinational circuits 12; and a clock gate circuit 73 comprising an AND circuit 71 and a NOT circuit 72 which are controlled by the selection signal 211. In FIG. 6, the same reference numerals as those shown in FIG. 1 denote the same or corresponding parts and, therefore, repeated description is not necessary.

Next, the operation of the semiconductor device 1a having the selector circuit 22a constructed as mentioned above will be described with reference to FIG. 7.

Figure 7:
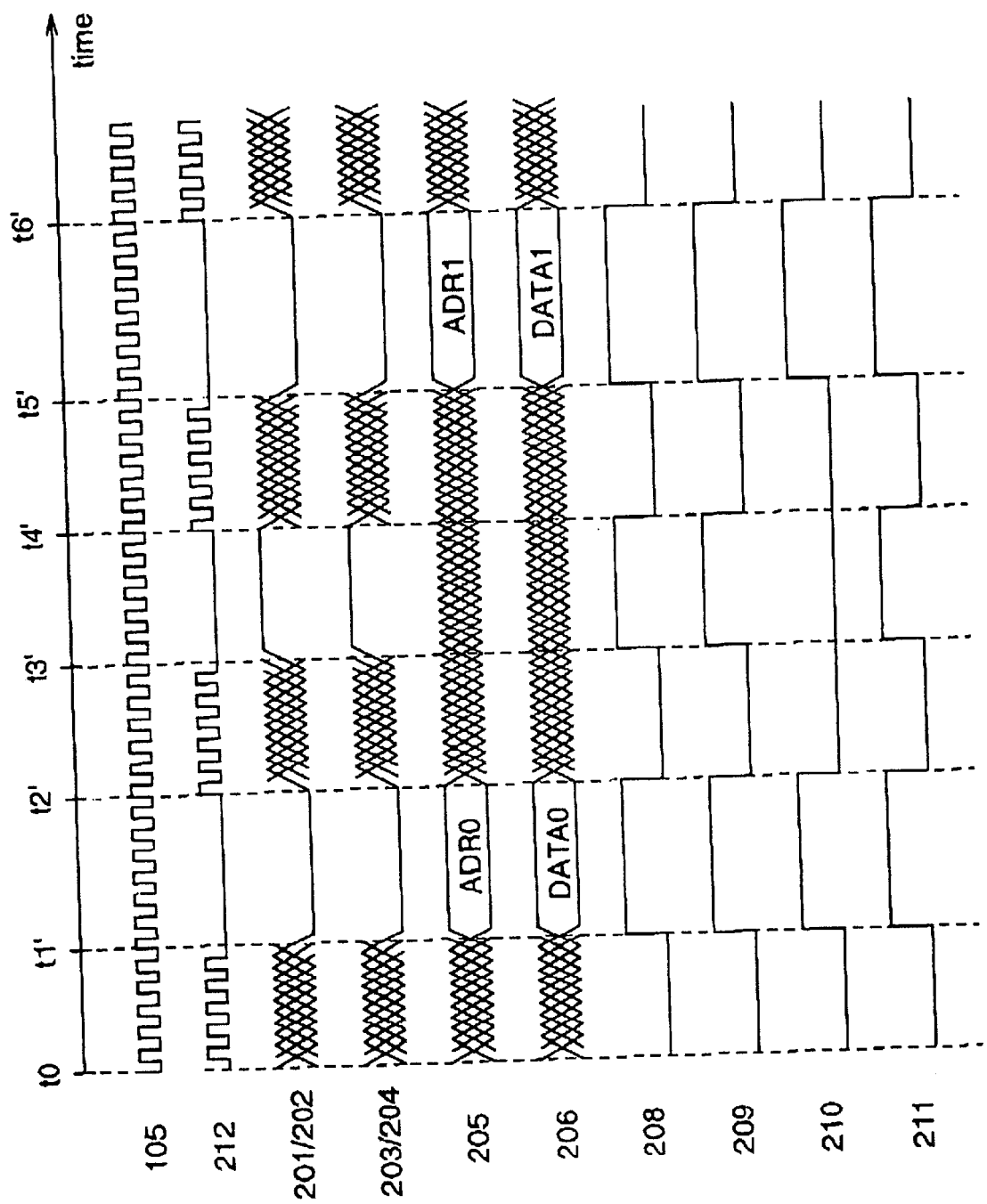
FIG. 7 is an operation timing chart of the selector circuit according to the fifth embodiment.

FIG. 7 is a timing chart for explaining the operation of the semiconductor device 1a according to the fourth embodiment. In FIG. 7, t0–t1', t2'–t3', and t4'–t5' are scan shift periods, and t1'–t2', t3'–t4', and t5'–t6' are stress application periods to the memory 2.

As in the above-mentioned embodiments, the memory 2 is operated when the write signal 201, read signal 202, chip select signal 203, and output permission signal 204 are "0" and the input selectors 51 select the signals 502 which are directly outputted from the flip-flops 11 in the scan chain 14 when the selection signals 208, 209, and 211 are "1".

Initially, at time t0, signals of "0" are given to the selection signals 208, 209, 210, and 211 from the external input terminal group 23 through the control circuit 21 (not shown).

By this setting, the input selectors 51 select the signals 501 at the normal operation, and the output values which have been passed through the combinational circuits 12 are selected as the write signal 201, read signal 202, chip select signal 203, output permission signal 204, address signal 205, and write data signal 206, whereby undefined values are inputted to the memory 2.

Next, during a period from t0 to t1', as described for the first embodiment, "0" is set on the flip-flops 11 in the scan chain 14 which are connected to the write signal 201, read signal 202, chip select signal 203, and output permission signal 204, respectively, from the scan input terminal 16 by scan shift, and further, an address value to which stress is to be applied and a data value are set to the flip-flops 11 connected to the address signal 205 and the write data signal 206, respectively, by scan shift.

Next, at time t1', signals of "1" are given to the selection signals 208, 209, 210, and 211 from the external input terminal group 23 through the control circuit 21 (not shown). By this setting, the input selectors 51 select the signals 502 which are directly outputted from the respective flip-flops 11 in the scan chain 14, and the clock gate circuit 73 stops the supply of the clock signal 212 to the respective flip-flops 11 in the scan chain 14.

During a period from t1' to t2', although the clock signal 105 is supplied to the memory 2 by plural times, since the clock signal 212 is not supplied from the clock gate circuit 73 to the respective flip-flops 11 in the scan chain 14, the flip-flops 11 do not update the data but hold the present output values.

After the clock 105 has been supplied to the memory 2 by a desired number of times, at time t2', "0" is again set on the selection signals 208, 209, 210, and 211 from the external input terminal group 23 through the control circuit 21 (not shown). During a period from t2' to t3', is set by scan shift on the write signal 201, read signal 202, chip select signal 203, and output permission signal 204, and data are set on the flip-flops 11 in the scan chain 14.

At time t3', signals of "1" are given to the selection signals 208, 209, and 211 from the external input terminal group 23 through the control circuit 21 (not shown) and, during a period from t3' to t4', "1" is set on the write signal 201, read signal 202, chip select signal 203, and output permission signal 204 from the scan input terminal 16 by scan shift, thereby applying stress to the memory 2.

At time t4', "0" is set on the selection signals 208, 209, and 211 from the external input terminal group 23 through the control circuit 21 (not shown), and "0" is set on the flip-flops 11 connected to the write signal 201, read signal 202, chip select signal 203, and the output permission signal 204, respectively, from the scan input terminal 16 by scan shift. Further, an address value and write data, which are different from those to which stress was applied during the period from t1 to t2, are set on the flip-flops 11 in the scan chain 14 which are connected to the address signal 205 and the write data signal 206, respectively, by scan shift.

At time t5', signals of "1" are given to the selection signals 208, 209, 210, and 211 from the external input terminal group 23 through the control circuit 21 (not shown). During a period from t5' to t6', the clock signal 105 is supplied to the memory 2 by plural times.

A series of operations described above are repeated by the number of times equal to the number of the addresses in the sequential memory 2, whereby stress can be applied to the entire area of the memory 2.

As described above, according to the fourth embodiment, the selector circuit is provided with the clock gate circuit 73 which comprises the AND circuit 71 and the NOT circuit 72 and is controlled by the selection signal 211, for holding the data values in the respective flip-flops connected to the signals inputted to the memory 2 as a test target, and the clock gate circuit 73 generates the clock signal 212 to be supplied to the respective flip-flops 11, on the basis of the clock signal 105 supplied from the clock generation circuit 103. Therefore, during the stress application period, the hold circuit for holding the data values in the respective flip-flops 11 can be easily constructed by stopping the supply of the clock signal 212 to the flip-flops 11, whereby the area of the semiconductor device 1a can be reduced.

While in this fourth embodiment the AND circuit 71 and the NOT circuit 72 are employed as the constituents of the clock gate circuit 73 for generating the clock signal 212, the same functions and effects as mentioned above can be achieved when a function of stopping the supply of the clock signal is realized using plural elements.

Embodiment 5

Hereinafter, a semiconductor device according to a fifth embodiment of the present invention will he described.

In this fifth embodiment, the selector circuit 22 in the semiconductor device 1a according to the first embodiment, having a construction different from those of the third and fourth embodiments, will be described in detail and, more particularly, another construction of the address selector circuit 53 in the selector circuit 22 will be described.

In the third and fourth embodiments, address setting in the address selector circuit 53 must be carried out by scan shift by the number of times equal to the number of addresses in the memory 2 to apply stress to the entire area of the memory 2. In this fifth embodiment, however, stress can be automatically applied to the entire area of the memory 2.

Figure 8:
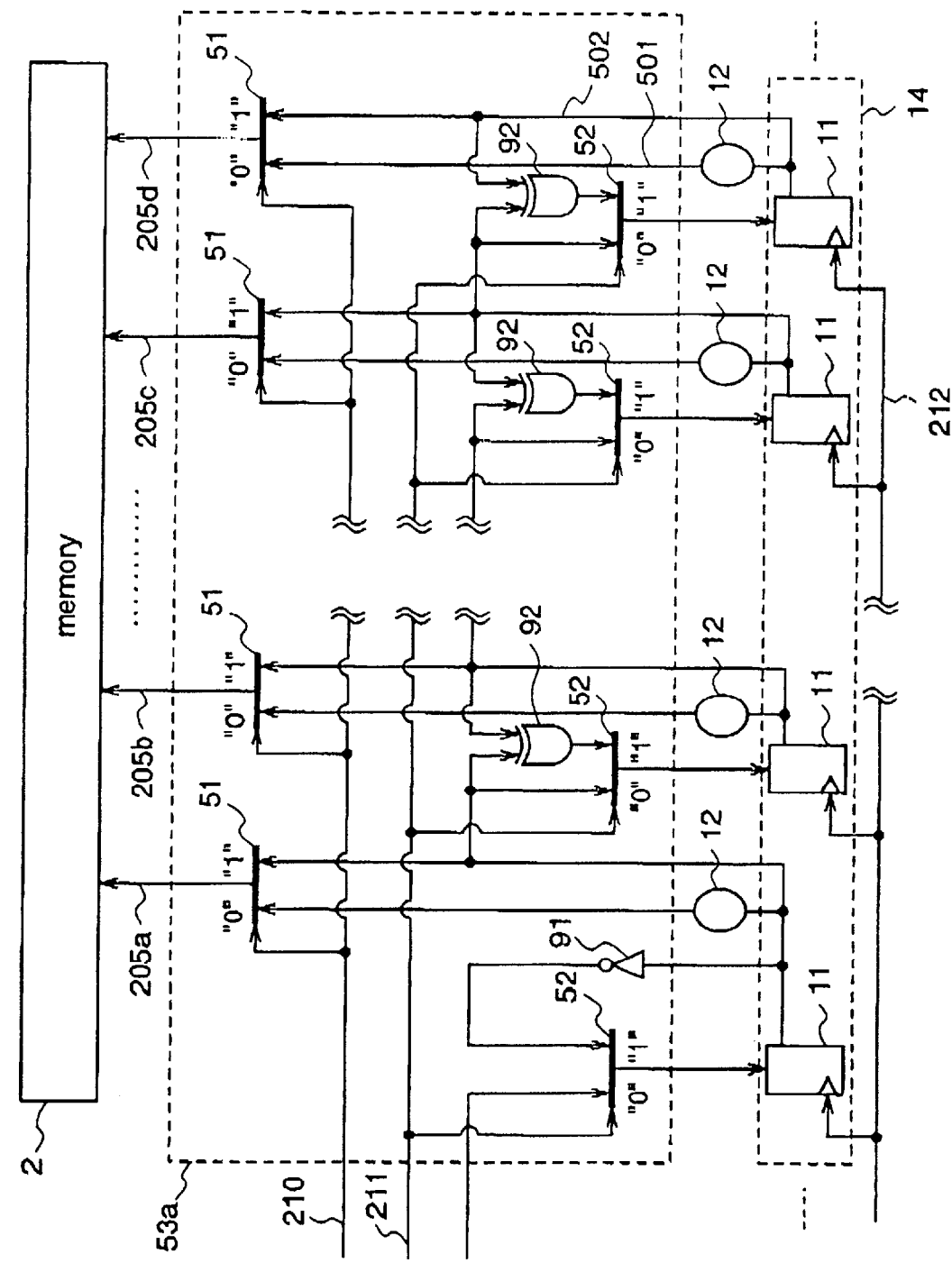
FIG. 8 is a block diagram of a selector circuit according to a sixth embodiment of the present invention.

FIG. 8 is a block diagram illustrating the specific construction of an address selector circuit 53a in the semiconductor device according to the fifth embodiment.

With reference to FIG. 8, the address selector circuit 53a according to the fifth embodiment comprises input selectors 51, output selectors 52, a NOT circuit 91 for a least significant bit, and an $EX_{13}OR$ (Exclusive OR) circuit 92 for bits other than the least significant bit. Assuming that the number of bits of an address in the memory 2 is N (N: natural number), 205a is a signal corresponding to the least significant bit of the address, 205b is a signal corresponding to the second bit, 205c is a signal corresponding to the (N-1)th bit, and 205d is a signal corresponding to the N-th bit. In FIG. 8, the same reference numerals as those shown in FIG. 4 denote the same or corresponding parts and, therefore, repeated description is not necessary.

Next, the operation of the semiconductor device according to the fifth embodiment will be described with reference to FIG. 9. Since the operation of the semiconductor device excluding the address selector circuit 53a is identical to that described for the fourth embodiment, repeated description is not necessary.

Figure 9:
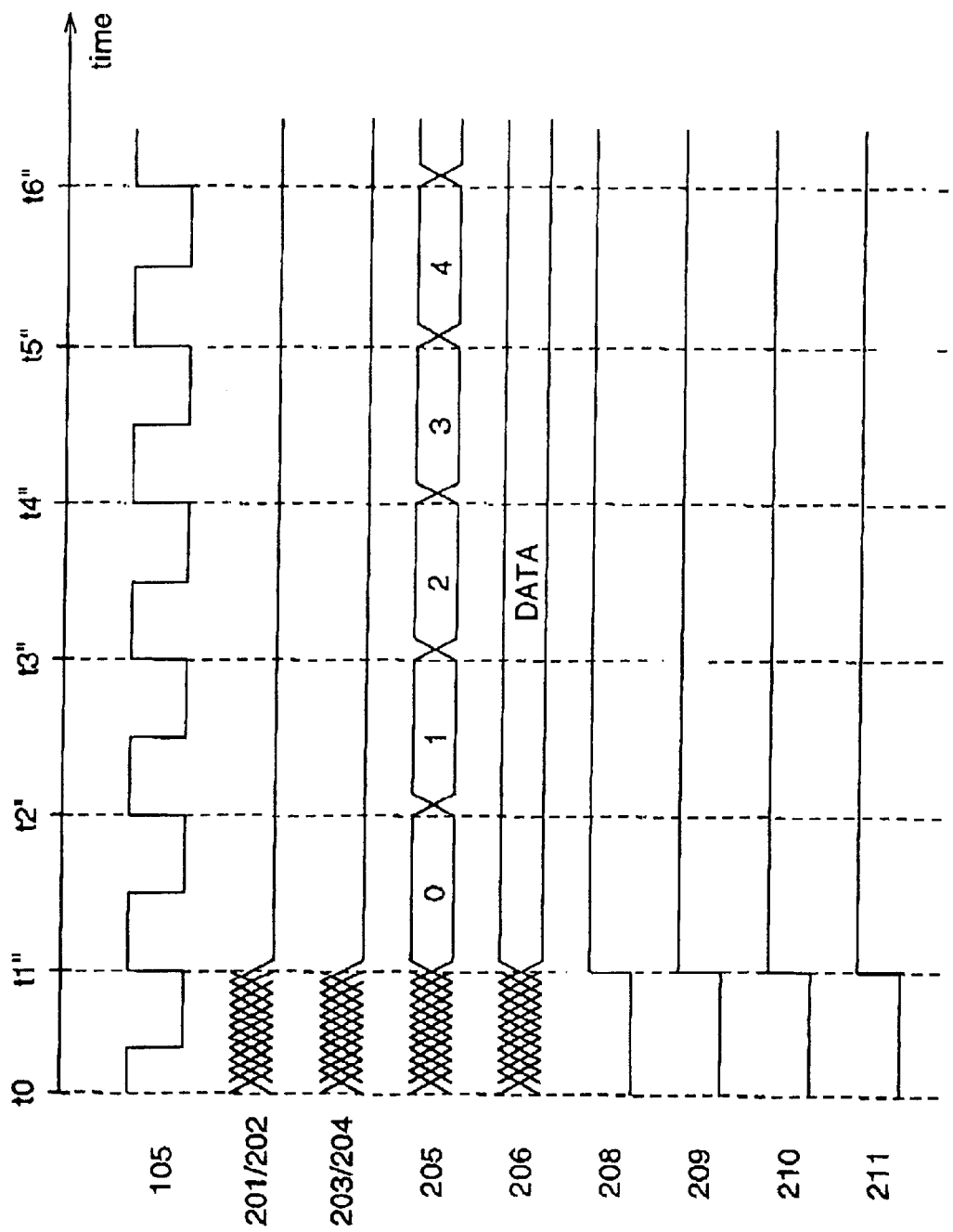
FIG. 9 is an operation timing chart of the selector circuit according to the sixth embodiment.
Figure 10:
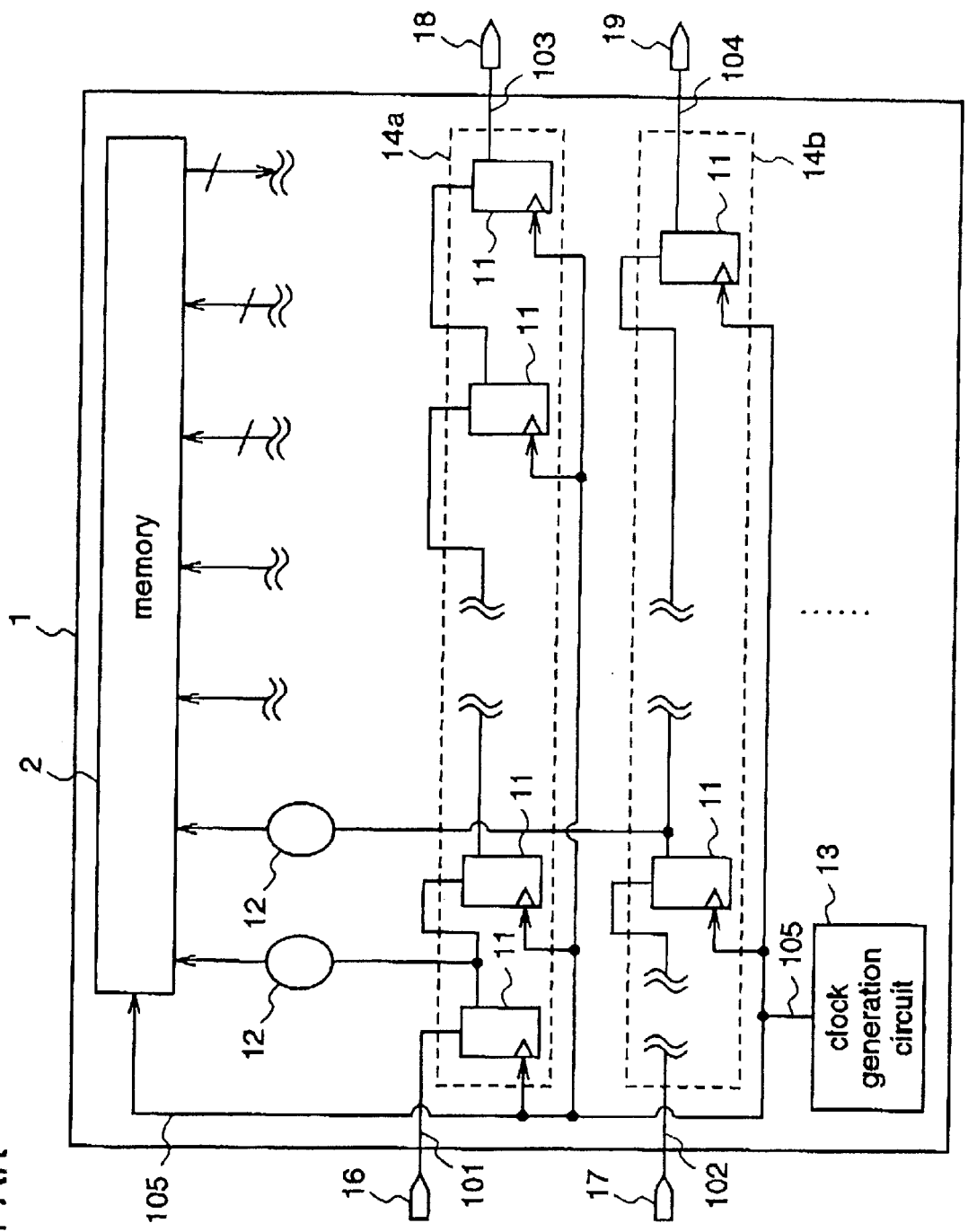
FIG. 10 is a block diagram illustrating a conventional semiconductor device.

FIG. 9 is a timing chart for explaining the operation of the semiconductor device according to the fifth embodiment. In FIG. 9, t0–t1" is a scan shift period, t1"–t2" is a period during which stress is applied to an address value "0", t2"–t3" is a period during which stress is applied to an address value "1", t3"–t4" is a period during which stress is applied to an address value "2", t4"–t5" is a period during which stress is applied to an address value "3", and t5"–t6" is a period during which stress is applied to an address value "4".

Initially, at time t0, signals of "0" are given to the selection signals 208, 209, 210, and 211 from the external input terminal group 23 through the control circuit 21 (not shown).

By this setting, the input selectors 51 select the signals 501 which have passed through the combinational circuits 12, and the output values from the combinational circuits 12, i.e., undefined values, are inputted to the memory 2 by the write signal 201, read signal 202, chip select signal 203, output permission signal 204, address signal 205, and write data 206. Further, by the above-mentioned setting, the output selectors 52 select the values of the previous-stage flip-flops 11, and update the values of the respective flip-flops 11 in the scan chain 14 to the values of the previous-stage flip-flops.

Next, during a period from time t0 to time t1", as described for the first embodiment, "0" is set on the respective flip-flops 11 in the scan chain 14 which are connected to the write signal. 201, read signal 202, chip select signal 203, and output permission signal 204, by scan shift from the scan input terminal 16 (not shown), and "0" is set on the flip-flop 11 connected to the address signal 205 so that all bits of the address signal 205 become "0", and further, data to which stress is to be applied is set on the flip-flops 11 connected to the write data signal 206, by scan shift.

Next, at time t1", signals of "1" are given to the selection signals 208, 209, 210, and 211 from the external input terminal regroup 23 through the control circuit 21 (not shown).

By this setting, the input selectors 51 select the signals 502 which have directly been outputted from the respective flip-flops 11 in the scan chain 14, and output the signals 502 to the memory 2. Further, the output selectors 52 select the values of the respective flip-flops 11 so that the flip-flops 11 hold the current values. In the address selector circuit 53a, "1", which is obtained by inverting the output value "0" at the present time with the NOT circuit 91, is inputted to the flip-flop 11 connected to the least significant bit of the address, while the results of $EX_{13}OR$ performed between the output values of the previous-stage flip-flops and the output values of the flip-flops at the present time are inputted to the flip-flops 11 connected to the other bits.

Since the $EX_{13}OR$ circuit 92 is a 1-bit addition circuit, the currently held value "0" of the respective flip-flops 11 in the scan chain 14, which are connected to the address signals 205a, 205b, 205c, and 205d during a period from time t1"to time t2", is subjected to stress as the address of the memory 2.

During a period from time t2" to time t3", the clock signal 212 is supplied to the memory 2 and to the respective flip-flops in the scan chain 14, whereby the present values "0" held by the flip-flops 11 in the scan chain 14, which are connected to the address signals 205a, 205b, 205c, and 205d, are incremented by one to be updated to "1".

During a period from time t3" to time t4", the clock signal 212 is supplied to the memory 2 and to the respective flip-flops in the scan chain 14, whereby the values of the flip-flops 11 in the scan chain 14, which are connected to the address signals 205a, 205b, 205c, and 205d, are further incremented by one to be updated to "2".

During a period from time t4" to time t5", the clock signal 212 is supplied to the memory 2 and to the respective flip-flops in the scan chain 14, whereby the values of the flip-flops 11 in the scan chain 14, which are connected to the address signals 205a, 205b, 205c, and 205d, are further incremented by one to be updated to "3".

During a period from time t5" to time t6", the clock signal 212 is supplied to the memory 2 and to the respective flip-flops in the scan chain 14, whereby the values of the flip-flops 11 in the scan chain 14, which are connected to the address signals 205a, 205b, 205c, and 205d, are further incremented by one to be updated to "4".

That is, when the clock signal 212 is supplied to the memory 2 and to the respective flip-flops 11 in the scan chain 14, the flip-flops 11 in the scan chain 14, which are connected to the address signals 205a, 205b, 205c, and 205d, serve as up counters, whereby the address of the memory 2 is incremented. Therefore, by repeating the supply of the clock signal 212 by the number of times equal to the number of addresses in the memory, stress can be automatically applied to the entire area of the memory 2, without the necessity of address setting.

As described above, according to the sixth embodiment of the present invention, the up-counter function is realized by adding the NOT circuit 91 and the $EX_{13}OR$ circuit 92 to the existing scan chain 14 in the semiconductor device 1a, without providing the semiconductor device 1a with an up-counter circuit. Therefore, stress can be automatically applied to the entire area of the memory 2, without the necessity of address setting, while minimizing an increase in the number of gates in the semiconductor device 1a.

While in this sixth embodiment the circuit with the up-counter function to be added to the semiconductor device 1a is realized by connecting the NOT circuit 91 and the $EX_{13}OR$ circuit 92 to the output selectors 52 in the address selector circuit 53a, the present invention is not restricted thereto. Any element having a counter function, whether an up-counter or a down-counter, can achieve the same functions and effects as described above. Further, while in this sixth embodiment the address selector circuit 53a having the up-counter function for the addresses in the memory 2 is provided to automatically apply stress to the entire area of the memory 2, a circuit having a similar up-counter function for the write data of the memory 2 may be mounted on the semiconductor device 1a, whereby an increase in the number of gates in the semiconductor device 1a can be minimized.

Furthermore, while in the first to sixth embodiments of the present invention a digital circuit semiconductor device having a memory 2 has been described, the present invention is also applicable to a circuit having no memory 2 or an analog circuit to which digital signals can be inputted, with the same merits as described above.

What is claimed is:

1. A semiconductor device comprising:

a test circuit to be subjected to a test;

plural flip-flops which are connected in a scan chain; and a selector circuit for receiving the outputs from the plural flip-flops, and the outputs from combinational circuits which receive the outputs from the plural flip-flops, selecting the outputs from the plural flip-flops as test signals when the semiconductor device is in a test mode, and outputting the test signals to the test circuit, thereby to operate the test circuit.

2. The semiconductor device of claim 1 further comprising:

a control circuit for outputting plural control signals for controlling the selecting operation of the selector circuit; and said control circuit having a decoder circuit for decoding signals of predetermined contents, which are supplied external to the semiconductor device, and outputting signals corresponding to the contents of the decoded signals, as the control signals, to the selector circuit.

3. The semiconductor device of claim 2, wherein said control circuit further includes plural flip-flops which are connected in a scan chain, said flip-flops holding the signals supplied external to the semiconductor device, and outputting the signals to the decoder circuit.

4. The semiconductor device of claim 1, wherein said selector circuit comprises:

first selectors for receiving the outputs from the plural flip-flops and the outputs from the combinational circuits, selecting the outputs from the plural flip-flops as the test signals during the test mode, and outputting the test signals to the test circuit, thereby to operate the test circuit; and second selectors for receiving the outputs from the plural flip-flops and the outputs from the flip-flops in the stages previous to the respective flip-flops, selecting the outputs from the respective flip-flops during the test mode, thereby to make the respective flip-flops maintain the present values.

5. The semiconductor device of claim 1, wherein said plural flip-flops are operated on the basis of a clock signal supplied external to the semiconductor device; and said semiconductor device further includes a logic gate circuit for stopping the supply of the clock signal during the test mode, thereby to make the respective flip-flops maintain the present values.

6. The semiconductor device of claim 1, wherein said selector circuit includes a data generation circuit for counting up or down the values which are held by N (N: natural number) flip-flops among the plural flip-flops, according to a clock signal supplied external to the semiconductor device, and outputting the counted up or down values held by the N flip-flops as the test signals to the test circuit, thereby to operate the test circuit.

7. The semiconductor device of claim 6, wherein said data generation circuit comprises:

first selectors for receiving the outputs from the N flip-flops, and the outputs from N combinational circuits which receive the outputs from the N flip-flops, selecting the outputs from the respective flip-flops as the test signals during the test mode, and outputting the test signals to the test circuit, thereby to operate the test circuit;

a second selector for a least significant bit, which receives the output from a NOT circuit that receives the output from a flip-flop for a least significant bit, and the output from a flip-flop in the stage previous to the flip-flop for the least significant bit, among the N flip-flops; and second selectors for bits other than the least significant bit, which receives the outputs from an $EX_{13}OR$ circuit that receives the outputs from (N−1) flip-flops for the bits other than the least significant bit, and the outputs from the flip-flops in the stages previous to the (N−1) flip-flops, among the N flip-flops.

8. The semiconductor device of claim 6, wherein when the semiconductor device is in the test mode, the data generation circuit sets an address of N bits of the test circuit, which address is to be inputted as one of the test signals.

9. The semiconductor device of claim 6, wherein when the semiconductor device is in the test mode, the data generation circuit sets a data value of N bits of the test circuit, which data value is to be inputted as one of the test signals.

10. The semiconductor device of claim 1, wherein the test circuit is a memory.

11. The semiconductor device of claim 1, wherein the test circuit is an analog circuit to which digital signals can be inputted.

* * * * *